(12) United States Patent
Togashi

(10) Patent No.: US 7,567,151 B2
(45) Date of Patent: Jul. 28, 2009

(54) MULTILAYER FILTER

(75) Inventor: Masaaki Togashi, Tokyo (JP)

(73) Assignee: TDK Corporation, Tokyo (JP)

( * ) Notice: Subject to any disclaimer, the term of this patent is extended or adjusted under 35 U.S.C. 154(b) by 102 days.

(21) Appl. No.: 11/822,523

(22) Filed: Jul. 6, 2007

(65) Prior Publication Data

US 2008/0036555 A1 Feb. 14, 2008

(30) Foreign Application Priority Data

Aug. 9, 2006 (JP) ............................ 2006-217260

(51) Int. Cl.
*H03H 7/01* (2006.01)
(52) U.S. Cl. ...................................... 333/172; 333/185
(58) Field of Classification Search ................ 333/172, 333/185; 361/306.1, 306.2, 307, 309, 311
See application file for complete search history.

(56) References Cited

U.S. PATENT DOCUMENTS

| 4,573,101 | A | * | 2/1986 | Takeno | ..................... 361/321.1 |
| 6,762,654 | B1 | * | 7/2004 | Tanaka | ........................ 333/140 |
| 7,388,737 | B2 | | 6/2008 | Togashi et al. | |

FOREIGN PATENT DOCUMENTS

| JP | A-6-275462 | 9/1994 |
| JP | A-7-161575 | 6/1995 |
| JP | A-7-161576 | 6/1995 |
| JP | A-8-195636 | 7/1996 |
| JP | A-11-54363 | 2/1999 |
| JP | A 2000-58382 | 2/2000 |
| JP | A-2003-151850 | 5/2003 |
| JP | A-2006-196685 | 7/2006 |

* cited by examiner

*Primary Examiner*—Benny Lee
*Assistant Examiner*—Gerald Stevens
(74) *Attorney, Agent, or Firm*—Oliff & Berridge, PLC

(57) ABSTRACT

A multilayer filter has a capacitor element body, at least two signal terminal electrodes, at least one grounding terminal electrode, and at least one connection conductor. The capacitor element body has a plurality of laminated insulator layers, a first signal internal electrode and a grounding internal electrode arranged so as to be opposed to each other with at least one insulator layer out of the plurality of insulator layers in between, and a second signal internal electrode arranged so as to be opposed to either one internal electrode of the first signal internal electrode and the grounding internal electrode with at least one insulator layer out of the plurality of insulator layers in between. The first signal internal electrode is connected to the at least one connection conductor. The second signal internal electrode is connected to the at least two signal terminal electrodes and to the at least one connection conductor. The grounding internal electrode is connected to the at least one grounding terminal electrode.

1 Claim, 7 Drawing Sheets

MULTILAYER FILTER

BACKGROUND OF THE INVENTION

1. Field of the Invention

The present invention relates to a multilayer filter.

2. Related Background Art

One of the known multilayer filters is a multilayer filter having a multilayer body consisting of a plurality of dielectric layers, an input electrode, an output electrode, and a ground electrode provided on the exterior of the multilayer body, a resistor connected between the input electrode and the output electrode, first conductor electrodes separated portions of which are connected to the input electrode and the other separated portions of which are connected to the output electrode, and second conductor electrodes connected to the ground electrode, wherein a capacitance is generated between the first and second conductor electrodes. (For example, reference is made to Japanese Patent Application Laid-open No. 2000-58382.) The multilayer filter described in the Laid-open No. 2000-58382 is a so-called CR filter, in which the resistance of the resistor is adjusted by changing a compounding ratio of a dielectric powder in a resistive paste for formation of the resistor.

SUMMARY OF THE INVENTION

However, when the filter has the resistor and is adapted to adjust the resistance of the resistor by changing the compounding ratio of the dielectric powder in the resistive paste like the multilayer filter described in the Laid-open No. 2000-58382, it is extremely difficult to accurately control the resistance of the resistance component in the CR filter. In the case of the multilayer filter described in the Laid-open No. 2000-58382, it is particularly difficult to set the resistance of the resistance component to a large value.

An object of the present invention is to provide a multilayer filter capable of accurately controlling the resistance of the resistance component.

A multilayer filter according to the present invention is a multilayer filter comprising: a capacitor element body; at least two signal terminal electrodes placed on an exterior of the capacitor element body; at least one grounding terminal electrode placed on the exterior of the capacitor element body; and at least one connection conductor placed on the exterior of the capacitor element body; wherein the capacitor element body has a plurality of laminated insulator layers, a first signal internal electrode and a grounding internal electrode arranged so as to be opposed to each other with at least one insulator layer out of the plurality of insulator layers in between, and a second signal internal electrode arranged so as to be opposed to either one internal electrode of the first signal internal electrode and the grounding internal electrode with at least one insulator layer out of the plurality of insulator layers in between; wherein the first signal internal electrode is connected to the at least one connection conductor; wherein the second signal internal electrode is connected to the at least two signal terminal electrodes and to the at least one connection conductor; and wherein the grounding internal electrode is connected to the at least one grounding terminal electrode.

In the multilayer filter according to the present invention, the signal internal electrodes include the second signal internal electrode connected to the signal terminal electrodes, and the first signal internal electrode connected indirectly to the signal terminal electrodes through the connection conductor.

Incidentally, where all the signal internal electrodes are connected to the signal terminal electrodes, resistance components formed by the respective signal internal electrodes are connected in parallel to the signal terminal electrodes. For this reason, a combined resistance of the resistance components formed by the signal internal electrodes becomes smaller. The combined resistance will be further decreased if the lamination number of insulator layers and internal electrodes is increased in order to set the capacitance of the multilayer filter to a larger value.

The Inventors conducted elaborate research on the multilayer filter capable of accurately controlling the resistance of the resistance component. As a result, the Inventors came to find the new fact that the combined resistance of the resistance components formed by the signal internal electrodes could be set to a desired value by connecting the signal internal electrodes through the connection conductor disposed on the exterior of the capacitor element body and changing the number of signal internal electrodes connected to the signal terminal electrodes. The Inventors also came to find the new fact that the combined resistance of the resistance components formed by the signal internal electrodes could also be set similarly to a desired value by connecting the signal internal electrodes through the connection conductor disposed on the exterior of the capacitor element body and changing the location of the signal internal electrode connected to the signal terminal electrodes. Particularly, where the number of signal internal electrodes connected to the signal terminal electrodes is set smaller than the total number of signal internal electrodes, i.e., where the filter has the signal internal electrode connected indirectly to the signal terminal electrodes through the connection conductor, it becomes feasible to adjust the combined resistance so as to increase.

For the above reason, the present invention permits accurate control on the resistance of the resistance component. Particularly, the present invention permits the capacitance to be set to a large value and also permits the resistance of the resistance component in the CR filter to be set to a large value.

In this case, preferably, the capacitor element body is of a rectangular parallelepiped shape and has first and second principal faces of a rectangular shape opposed to each other, first and second side faces extending in a longer-side direction of the first and second principal faces so as to connect the first and second principal faces, and opposed to each other, and first and second end faces extending in a shorter-side direction of the first and second principal faces so as to connect the first and second principal faces, and opposed to each other; the signal terminal electrodes are disposed on the first and second end faces, respectively; the grounding terminal electrodes are disposed on the first and second side faces, respectively; the connection conductors are disposed on the first and second side faces, respectively; the first signal internal electrode includes a main electrode portion whose longer sides extend along the longer-side direction of the first and second principal faces, and lead portions extending from the main electrode portion toward the first and second side faces, respectively, and connected to the respective connection conductors; the second signal internal electrode includes a main electrode portion whose longer sides extend along the longer-side direction of the first and second principal faces, lead portions extending from the main electrode portion toward the first and second end faces, respectively, and connected to the respective signal terminal electrodes, and lead portions extending from the main electrode portion toward the first and second side faces, respectively, and connected to the respective connection conductors; the grounding internal electrode includes a main electrode portion whose longer sides extend along the longer-side direction of the first and second principal faces, and lead portions extending from the main electrode portion toward the first and second side faces, respectively, and connected to the respective grounding terminal electrodes.

The present invention successfully provides the multilayer filter capable of accurately controlling the resistance of the resistance component.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

The preferred embodiments of the present invention will be described below in detail with reference to the accompanying drawings. The same elements or elements with the same functionality will be denoted by the same reference symbols throughout the description, without redundant description.

Figure 1:
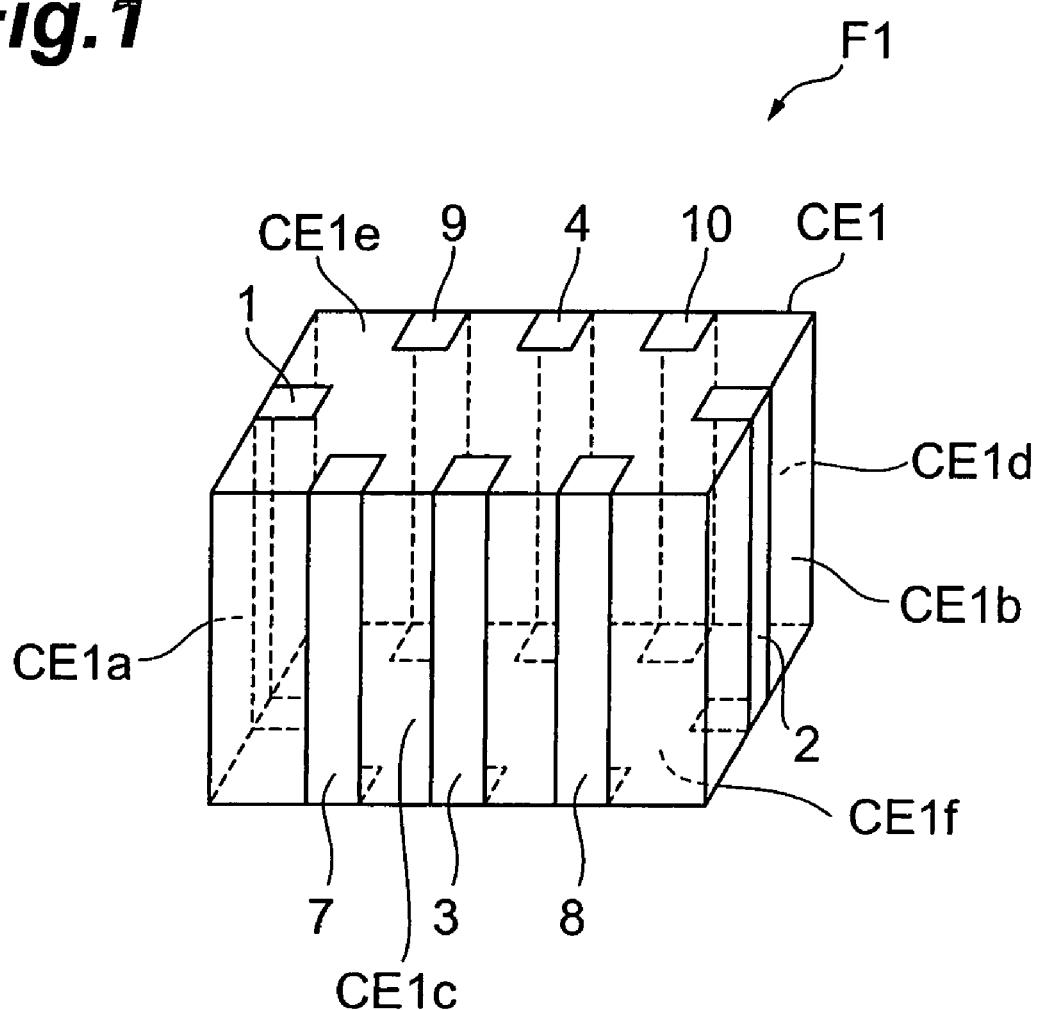
FIG. 1 is a perspective view of a multilayer filter according to an embodiment of the present invention.
Figure 2:
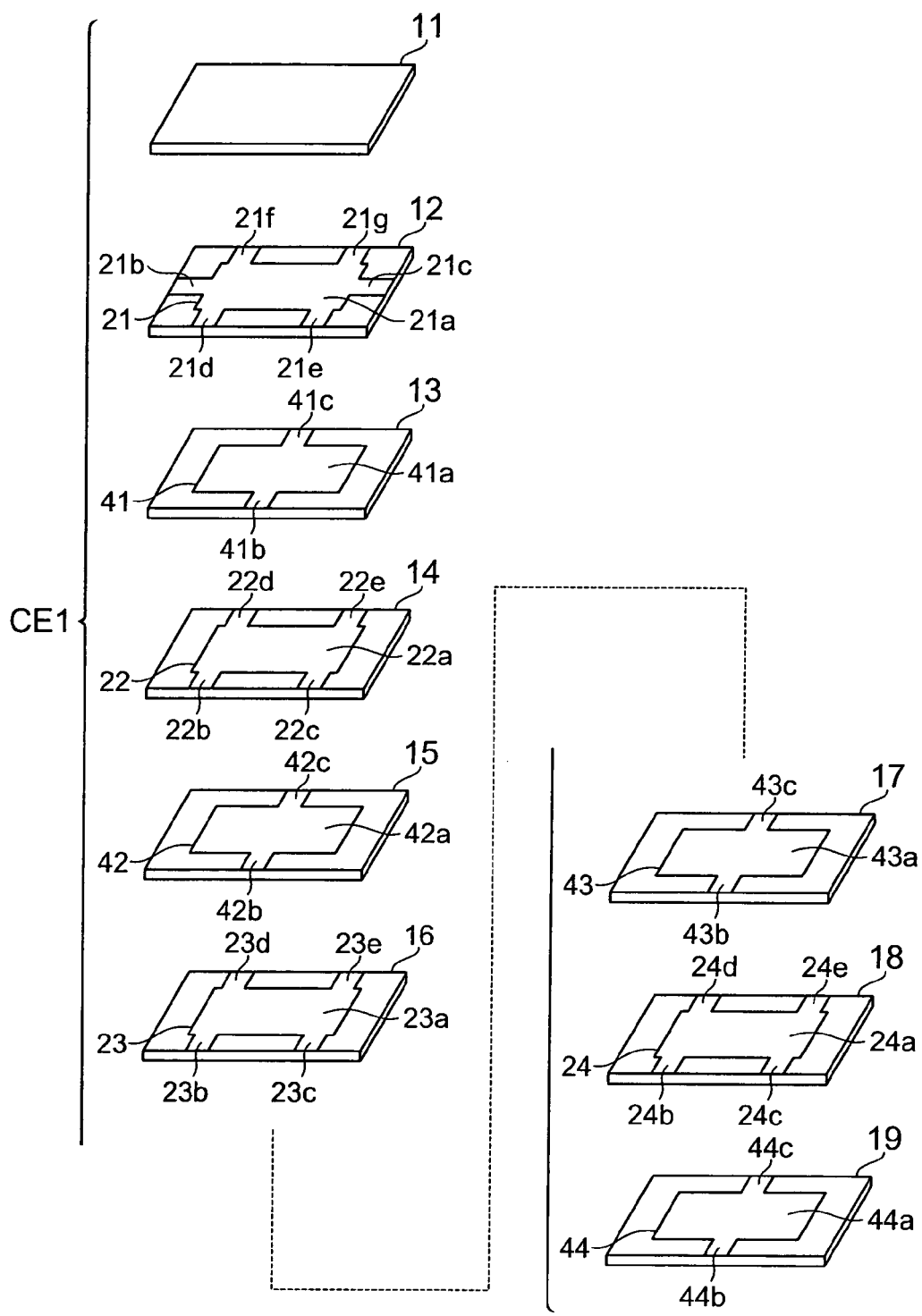
FIG. 2 is an exploded perspective view of a capacitor element body included in the multilayer filter of the embodiment.

A configuration of a multilayer filter F1 according to an embodiment of the present invention will be described with reference to FIGS. 1 and 2. FIG. 1 is a perspective view of the multilayer filter according to the present embodiment. FIG. 2 is an exploded perspective view of a capacitor element body included in the multilayer filter according to the present embodiment.

The multilayer filter F1, as shown in FIG. 1, has a capacitor element body CE1, signal terminal electrodes 1, 2, grounding terminal electrodes 3, 4, and connection conductors 7-10. The signal terminal electrodes 1, 2, grounding terminal electrodes 3, 4, and connection conductors 7-10 are placed on the exterior of the capacitor element body CE1. The multilayer filter F1 is applicable, for example, as a noise filter for preventing leakage or intrusion of noise through wires for signals and others.

The capacitor element body CE1, as shown in FIG. 1, is of a rectangular parallelepiped shape and has first and second principal faces CE1e, CE1f, first and second end faces CE1a, CE1b, and first and second side faces CE1c, CE1d. The first and second principal faces CE1e, CE1f are rectangular and opposed to each other. The first and second end faces CE1a, CE1b extend in the shorter-side direction of the first and second principal faces so as to connect the first and second principal faces CE1e, CE1f, and are opposed to each other. The first and second side faces CE1c, CE1d extend in the longer-side direction of the first and second principal faces CE1e, CE1f so as to connect the first and second principal faces CE1e, CE1f, and are opposed to each other.

The signal terminal electrode 1 is disposed on the first end face CE1a of the capacitor element body CE1. The signal terminal electrode 1 is formed so as to cover a portion of the first end face CE1a and up onto the first and second principal faces CE1e, CE1f. The signal terminal electrode 2 is disposed on the second end face CE1b of the capacitor element body CE1. The signal terminal electrode 2 is formed so as to cover a portion of the second end face CE1b and up onto the first and second principal faces CE1e, CE1f. The signal terminal electrode 1 and the signal terminal electrode 2 are opposed to each other in the opposing direction of the first end face CE1a and the second end face CE1b.

The grounding terminal electrode 3 is disposed on the first side face CE1c of the capacitor element body CE1. The grounding terminal electrode 3 is formed so as to cover a portion of the first side face CE1c and up onto the first and second principal faces CE1e, CE1f. The grounding terminal electrode 4 is disposed on the second side face CE1d of the capacitor element body CE1. The grounding terminal electrode 4 is formed so as to cover a portion of the second side face CE1d and up onto the first and second principal faces CE1e, CE1f.

The connection conductors 7, 8 are disposed on the first side face CE1c of the capacitor element body CE1. The connection conductors 7, 8 are formed so as to cover a portion of the first side face CE1c and up onto the first and second principal faces CE1e, CE1f. The connection conductors 9, 10 are disposed on the second side face CE1d of the capacitor element body CE1. The connection conductors 9, 10 are formed so as to cover a portion of the second side face CE1d and up onto the first and second principal faces CE1e, CE1f.

The grounding terminal electrode 3 and the connection conductors 7, 8 are arranged in the order of connection conductor 7, grounding terminal electrode 3, and connection conductor 8 in the direction from the first end face CE1a to the second end face CE1b on the first side face CE1c of the capacitor element body CE1. The grounding terminal electrode 4 and the connection conductors 9, 10 are arranged in the order of connection conductor 9, grounding terminal electrode 4, and connection conductor 10 in the direction from the first end face CE1a to the second end face CE1b on the second side face CE1d of the capacitor element body CE1. The grounding terminal electrode 3 and the grounding terminal electrode 4 are opposed to each other in the opposing direction of the first side face CE1c and the second side face CE1d. The connection conductor 7 and the connection conductor 9 are opposed to each other in the opposing direction of the first side face CE1c and the second side face CE1d. The connection conductor 8 and the connection conductor 10 are opposed to each other in the opposing direction of the first side face CE1c and the second side face CE1d.

The signal terminal electrodes 1, 2, grounding terminal electrodes 3, 4, and connection conductors 7-10 are formed, for example, by applying an electroconductive paste containing an electroconductive metal powder and glass frit, onto the exterior of the capacitor element body CE1, and baking it. A plated layer may be formed on the baked terminal electrodes and connection conductors according to need. These signal terminal electrodes 1, 2, grounding terminal electrodes 3, 4, and connection conductors 7-10 are formed as being electrically isolated from each other on the surface of the capacitor element body CE1.

The capacitor element body CE1, as shown in FIG. 2, has a plurality of insulator layers 11-19 (nine layers in the present embodiment), and a plurality of internal electrodes 21-24, 41-44 (eight layers in the present embodiment). Each of the insulator layers 11-19 extends in the direction parallel to the first and second principal faces CE1e, CE1f and they are laminated in the opposing direction of the first and second principal faces CE1e, CE1f. Each insulator layer 11-19 is comprised, for example, of a sintered body of a ceramic green sheet containing a dielectric ceramic. In a practical multilayer filter F1, the insulator layers 11-19 are integrally formed so that no boundary can be visually recognized between them.

The plurality of internal electrodes 21-24, 41-44 include a plurality of signal internal electrodes 21-24 (four layers in the present embodiment) and a plurality of grounding internal electrodes 41-44 (four layers in the present embodiment). The signal internal electrodes 21-24 include first signal internal electrodes 22-24 and a second signal internal electrode 21. Each of the internal electrodes 21-24, 41-44 is comprised, for example, of a sintered body of an electroconductive paste.

A first signal internal electrode 22-24 and a grounding internal electrode 41-44 are arranged so as to be opposed to each other with one insulator layer 13-18 in between. Namely, the first signal internal electrode 22 and the grounding internal electrode 41 are opposed to each other with the insulator layer 13 in between. The first signal internal electrode 22 and the grounding internal electrode 42 are opposed to each other with the insulator layer 14 in between. The first signal internal electrode 23 and the grounding internal electrode 42 are opposed to each other with the insulator layer 15 in between. The first signal internal electrode 23 and the grounding internal electrode 43 are opposed to each other with the insulator layer 16 in between. The first signal internal electrode 24 and the grounding internal electrode 43 are opposed to each other with the insulator layer 17 in between. The first signal internal electrode 24 and the grounding internal electrode 44 are opposed to each other with the insulator layer 18 in between.

The second signal internal electrode 21 is arranged to be opposed to the grounding internal electrode 41 with one insulator layer 12 in between.

A first signal internal electrode 22-24 includes a main electrode portion 22a-24a, and lead portions 22b-24b, 22c-24c, 22d-24d, 22e-24e. The main electrode portion 22a-24a is of a rectangular shape whose longer sides extend along the longer-side direction of the first and second principal faces CE1e, CE1f. The main electrode portion 22a-24a and the lead portions 22b-24b, 22c-24c, 22d-24d, 22e-24e are integrally formed.

The lead portion 22b-24b' extends from the edge on the first end face CE1a side of the main electrode portion 21a toward the first side face CE1c and is led out to the first side face CE1c. The lead portion 22c-24c extends from the edge on the second end face CE1b side of the main electrode portion 21a toward the first side face CE1c and is led out to the first side face CE1c. The lead portion 22d-24d extends from the edge on the first end face CE1a side of the main electrode portion 21a toward the second side face CE1d and is led out to the second side face CE1d. The lead portion 22e-24e extends from the edge on the second end face CE1b side of the main electrode portion 21a toward the second side face CE1d and is led out to the second side face CE1d.

The lead portions 22b-24b, 22c-24c are located in the order of lead portion 22b-24b and lead portion 22c-24c in the direction from the first end face CE1a to the second end face CE1b. The lead portions 22d-24d, 22e-24e are located in the order of lead portion 22d-24d and lead portion 22e-24e in the direction from the first end face CE1a to the second end face CE1b.

The lead portion 22b-24b is electrically and physically connected to the connection conductor 7. The lead portion 22c-24c is electrically and physically connected to the connection conductor 8. The lead portion 22d-24d is electrically and physically connected to the connection conductor 9. The lead portion 22e-24e is electrically and physically connected to the connection conductor 10. These cause the first signal internal electrodes 22-24 to be electrically and physically connected to the connection conductors 7-10.

The second signal internal electrode 21 includes a main electrode portion 21a, and lead portions 21b-21g. The main electrode portion 21a is of a rectangular shape whose longer sides extend along the longer-side direction of the first and second principal faces CE1e, CE1f. The main electrode portion 21a and the lead portions 21b-21g are integrally formed.

The lead portion 21b extends from the edge on the first end face CE1a side of the main electrode portion 21a toward the first end face CE1a and is led out to the first end face CE1a. The lead portion 21c extends from the edge on the second end face CE1b side of the main electrode portion 21a toward the second end face CE1b and is led out to the second end face CE1b. The lead portion 21d extends from the edge on the first end face CE1a side of the main electrode portion 21a toward the first side face CE1c and is led out to the first side face CE1c. The lead portion 21e extends from the edge on the second end face CE1b side of the main electrode portion 21a toward the first side face CE1c and is led out to the first side face CE1c. The lead portion 21f extends from the edge on the first end face CE1a side of the main electrode portion 21a toward the second side face CE1d and is led out to the second side face CE1d. The lead portion 21g extends from the edge on the second end face CE1b side of the main electrode portion 21a toward the second side face CE1d and is led out to the second side face CE1d.

The lead portions 21d, 21e are located in the order of lead portion 21d and lead portion 21e in the direction from the first end face CE1a to the second end face CE1b. The lead portions 21f, 21g are located in the order of lead portion 21f and lead portion 21g in the direction from the first end face CE1a to the second end face CE1b.

The lead portion 21b is electrically and physically connected to the signal terminal electrode 1. The lead portion 21c is electrically and physically connected to the signal terminal electrode 2. The lead portion 21d is electrically and physically connected to the connection conductor 7. The lead portion 21e is electrically and physically connected to the connection conductor 8. The lead portion 21f is electrically and physically connected to the connection conductor 9. The lead portion 21g is electrically and physically connected to the connection conductor 10. These cause the second signal internal electrode 21 to be electrically and physically connected to the signal terminal electrodes 1, 2 and to the connection conductors 7-10.

A grounding internal electrode 41-44 includes a main electrode portion 41a-44a, and lead portions 41b-44b, 41c-44c. The main electrode portion 41a-44a is of a rectangular shape whose longer sides extend along the longer-side direction of the first and second principal faces CE1e, CE1f. The main electrode portion 41a-44a and the lead portions 41b-44b, 41c-44c are integrally formed. The lead portion 41b-44b extends from the central part in the longer-side direction of the main electrode portion 41a-44a toward the first side face CE1c and is led out to the first side face CE1c. The lead portion 41c-44c extends from the central part in the longer-side direction of the main electrode portion 41a-44a toward the second side face CE1d and is led out to the second side face CE1d.

The lead portion 41b-44b is electrically and physically connected to the grounding terminal electrode 3. The lead portion 41c-44c is electrically and physically connected to the grounding terminal electrode 4. These cause the grounding internal electrodes 41-44 to be electrically and physically connected to the grounding terminal electrodes 3, 4.

The main electrode portions 22a-24a of the first signal internal electrodes 22-24 and the main electrode portions 41a-44a of the grounding internal electrodes 41-44 are arranged so that their corresponding main electrode portions are opposed to each other with the insulator layer 13-18 in between. This results in forming a capacitance component having a predetermined capacitance. In the present embodiment, the main electrode portion 21a of the second signal internal electrode 21 and the main electrode portion 41a of the grounding internal electrode 41 are also opposed to each other with the insulator layer 12 in between, thereby forming a capacitance component.

Figure 3:
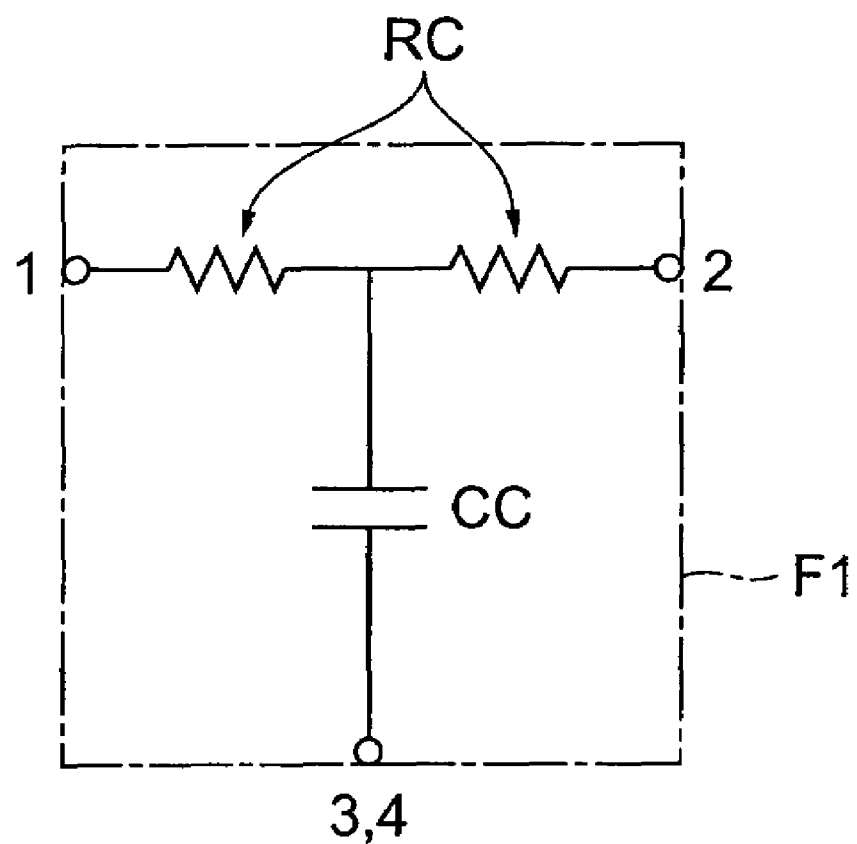
FIG. 3 is an equivalent circuit diagram of the multilayer filter of the embodiment.

In the multilayer filter F1 constructed as described above, a capacitance component CC and a resistance component RC are formed as shown in FIG. 3. In this case, the signal terminal electrodes 1, 2 are connected to signal conductors, the grounding terminal electrodes 3, 4 are connected to a ground connection conductor, and the connection conductors 7-10 are not connected directly to any signal conductor or any ground connection conductor. FIG. 3 is an equivalent circuit diagram of the multilayer filter according to the present embodiment.

The capacitance component CC is composed, as described above, of the insulator layers 12-18, and the signal internal electrodes 21-24 and the grounding internal electrodes 41-44 opposed to each other with the insulator layer 12-18 in between. The resistance component RC is composed of the signal internal electrodes 21-24 and the connection conductors 7-10. Therefore, the resistance component RC is connected in series between the signal terminal electrode 1 and the signal terminal electrode 2.

Incidentally, in the multilayer filter F1, all the signal internal electrodes 21-24 are not connected directly to the terminal electrodes, only at least one of the signal internal electrodes (second signal internal electrode 21) is directly connected to the signal terminal electrodes 1, 2, and the remaining signal internal electrodes (first signal internal electrodes 22-24) are connected indirectly to the signal terminal electrodes 1, 2 through the connection conductors 7-10 and the second signal internal electrode 21. Namely, in the multilayer filter F1, the plurality of signal internal electrodes 21-24 are connected to each other through the connection conductors 7-10, and the signal internal electrode or signal internal electrodes as many as at least one of the plurality of signal internal electrodes 21-24 and at most a number one smaller than the total number of the signal internal electrodes 21-24 (one signal internal electrode 21 in the present embodiment) are connected to the signal terminal electrodes 1, 2.

In the multilayer filter F1, with focus on the signal terminal electrode 1, the respective resistance components of the connection conductors 7-10 are connected in series to the signal terminal electrode 1. With focus on the signal terminal electrode 2, the respective resistance components of the connection conductors 7-10 are connected in series to the signal terminal electrode 2.

For these reasons, the multilayer filter F1 comes to have the resistance of the resistance component RC larger than a multilayer filter having a configuration in which all the signal internal electrodes 21-24 are connected through their lead portions to the signal terminal electrodes 1, 2.

In the multilayer filter F1, the resistance of the resistance component RC varies when the number of signal internal electrodes connected directly to the signal terminal electrodes 1, 2 is changed in the range of at least one and at most the number one smaller than the total number of the signal internal electrodes 21-24. In the multilayer filter F1, when the location of the signal internal electrode connected directly to the signal terminal electrodes 1, 2 (the position in the lamination direction in the capacitor element body CE1) is changed, connection states of the resistance components of the connection conductors 7-10 (series connection or parallel connection) vary, so as to vary the resistance of the resistance component RC.

In the present embodiment, as described above, the resistance of the resistance component RC of the multilayer filter F1 is set to a desired value by adjusting either or both of the number and location of the second signal internal electrode 21 connected directly to the signal terminal electrodes 1, 2 through the lead portions 21d, 21g. This permits us to readily and accurately control the resistance of the resistance component RC.

In the present embodiment, it is feasible to prevent the resistance of the resistance component RC of the multilayer filter F1 from becoming small, even in a case where the capacitance of the capacitance component CC is increased with increase in the lamination number of first signal internal electrodes 22-24 and grounding internal electrodes 41-44 in order to adapt for increase in capacitance.

In the present embodiment, the signal terminal electrodes 1, 2 are opposed to each other in the opposing direction of the first and second end faces CE1a, CE1b of the capacitor element body CE1. The grounding terminal electrodes 3, 4 are opposed to each other in the opposing direction of the first and second side faces CE1c, CE1d of the capacitor element body CE1. The connection conductors 7, 9 are opposed to each other in the opposing direction of the first and second side faces CE1c, CE1d of the capacitor element body CE1. The connection conductors 8, 10 are opposed to each other in the opposing direction of the first and second side faces CE1c, CE1d of the capacitor element body CE1. These facilitate connection of the signal terminal electrodes 1, 2, for example, to linear signal conductors and also facilitate connection of the grounding terminal electrodes 3, 4 to a linear ground connection conductor. These result in facilitating mounting of the multilayer filter F1.

Figure 4:
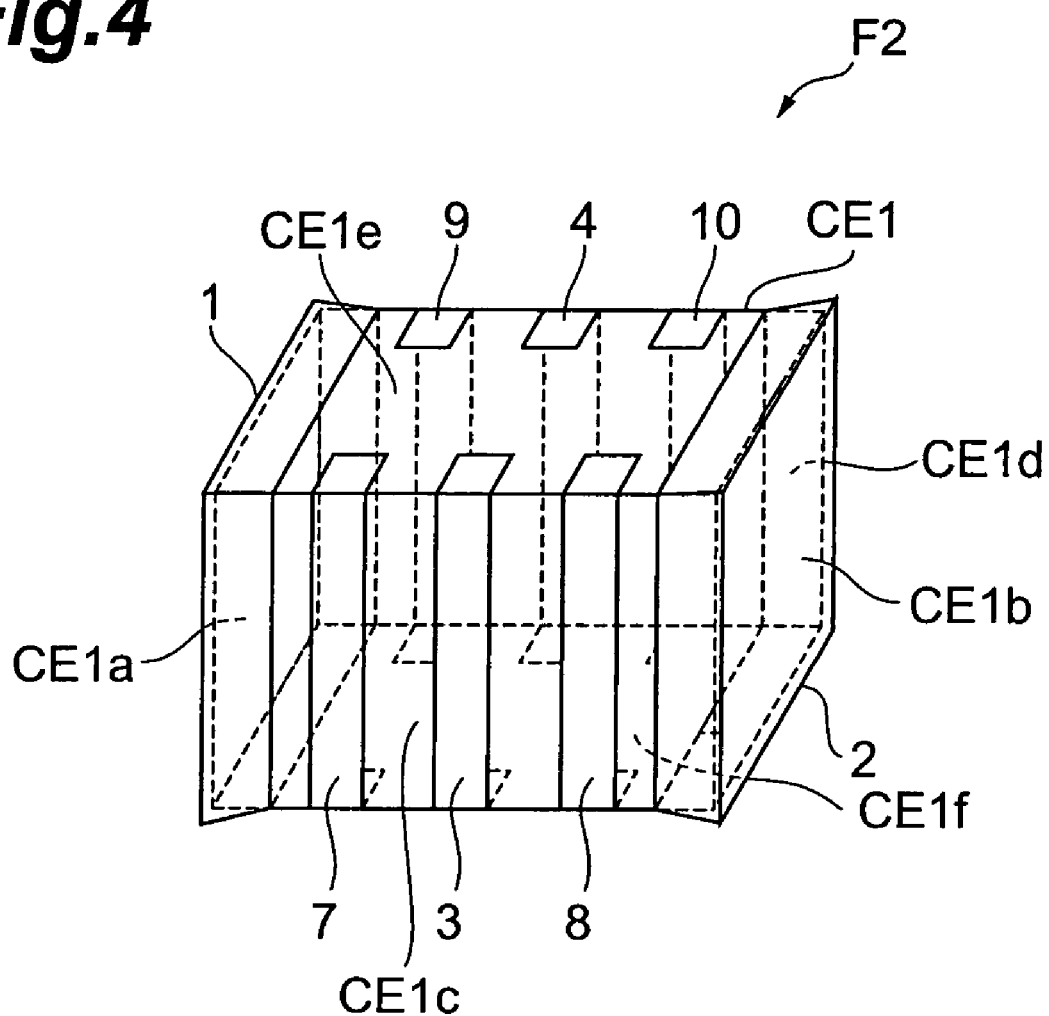
FIG. 4 is a perspective view of a multilayer filter according to a modification example of the embodiment.
Figure 5:
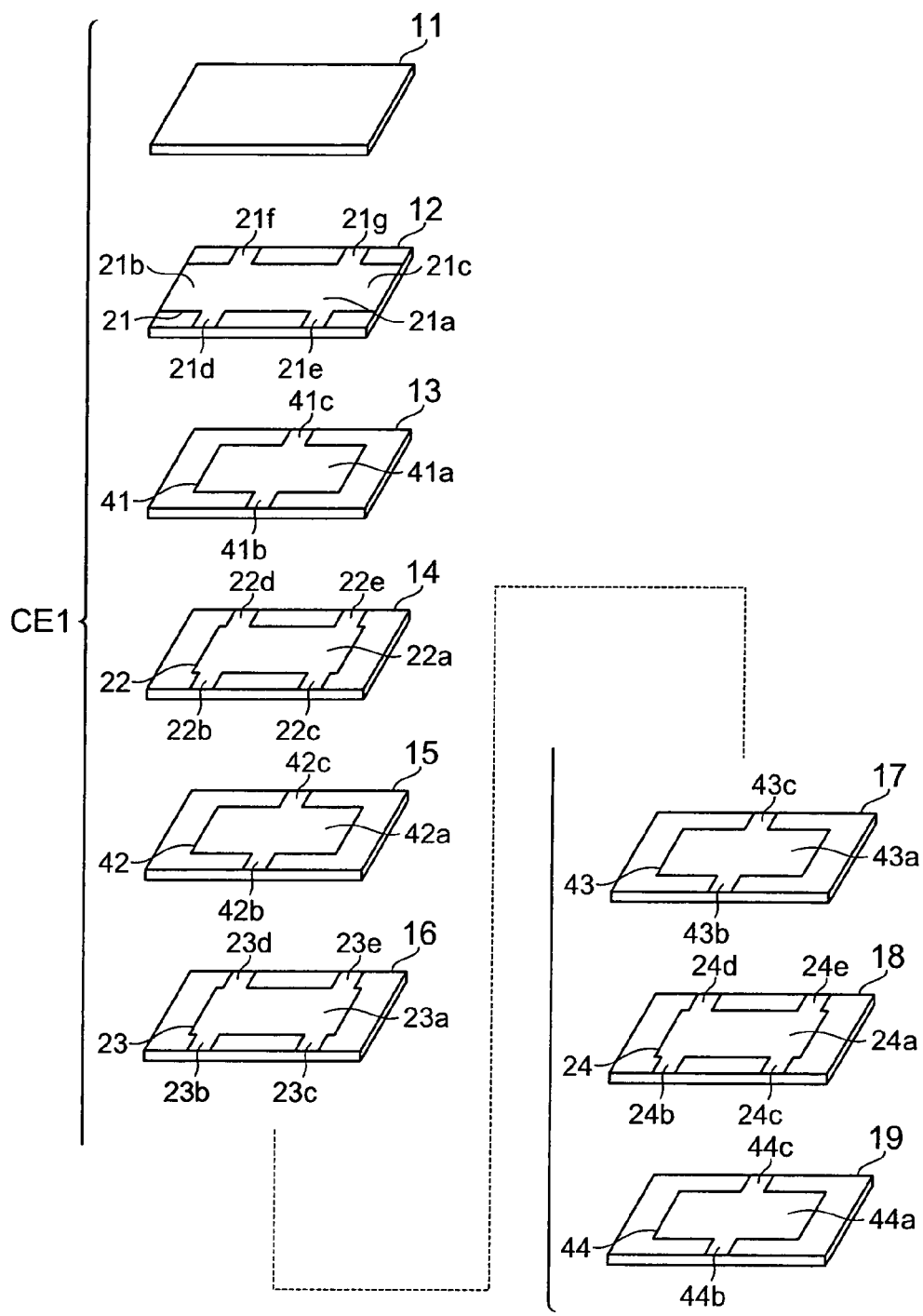
FIG. 5 is an exploded perspective view of a capacitor element body included in the multilayer filter according to the modification example of the embodiment.

Subsequently, a multilayer filter F2 according to a modification example of the embodiment will be described on the basis of FIGS. 4 and 5. The multilayer filter F2 of the present modification example is different in the shape of the signal terminal electrodes 1, 2 from the multilayer filter F1 of the embodiment described above. FIG. 4 is a perspective view showing the multilayer filter according to the modification example of the embodiment. FIG. 5 is an exploded perspective view showing a capacitor element body included in the multilayer filter of the modification example.

In the multilayer filter F2 of the modification example, as shown in FIG. 4, the signal terminal electrode 1 covers the entire surface of the first end face CE1a of the capacitor element body CE1 and a part of the other faces adjacent to the first end face CE1a (the first and second principal faces CE1e, CE1f and the first and second side faces CE1c, CE1d). The signal terminal electrode 2 covers the entire surface of the second end face CE1b of the capacitor element body CE1 and a part of the other faces adjacent to the second end face CE1b (the first and second principal faces CE1e, CE1f and the first and second side faces CE1c, CE1d). Widths of the lead portions 21b, 21c connected to the signal terminal electrodes 1, 2 (which are lengths in the opposing direction of the first and second side faces CE1c, CE1d) both are set to the same as the width of the main electrode portion 21a, as shown in FIG. 5.

In the present modification example, just as in the case of the aforementioned embodiment, we are allowed to readily and accurately control the resistance of the resistance component RC of the multilayer filter F2.

Figure 6:
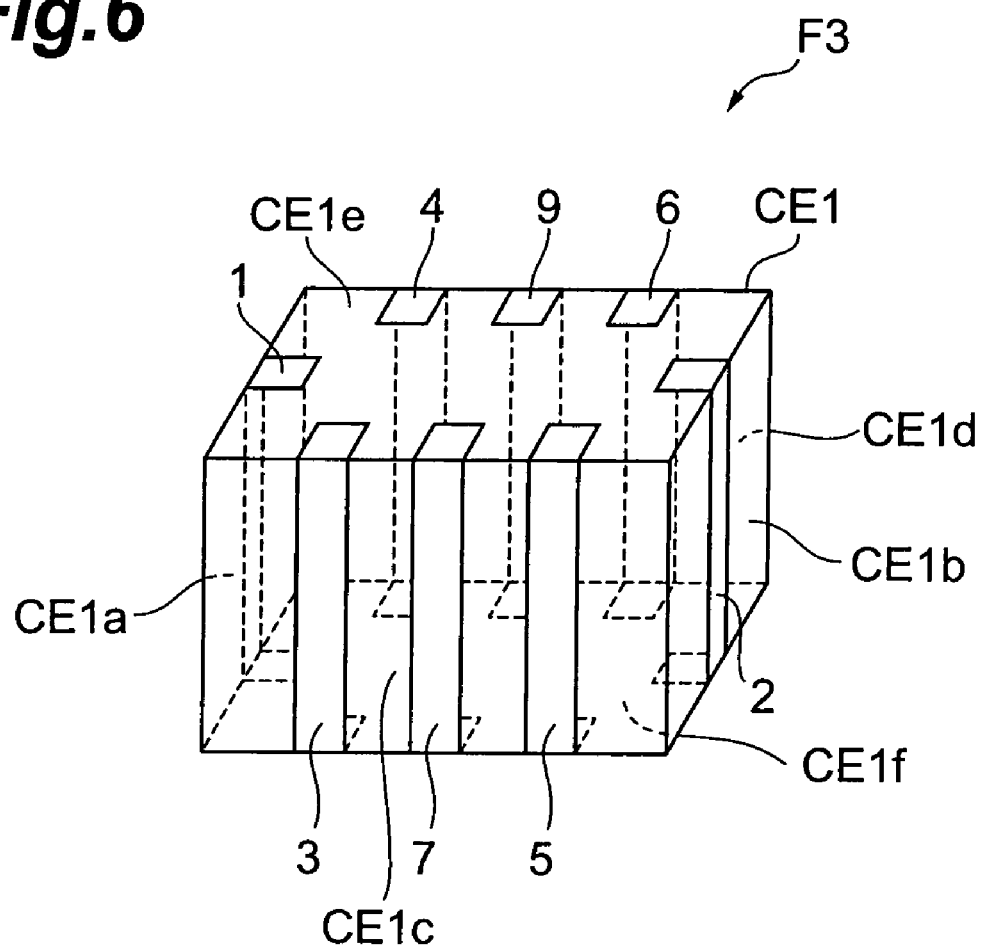
FIG. 6 is a perspective view of a multilayer filter according to another modification example of the embodiment.
Figure 7:
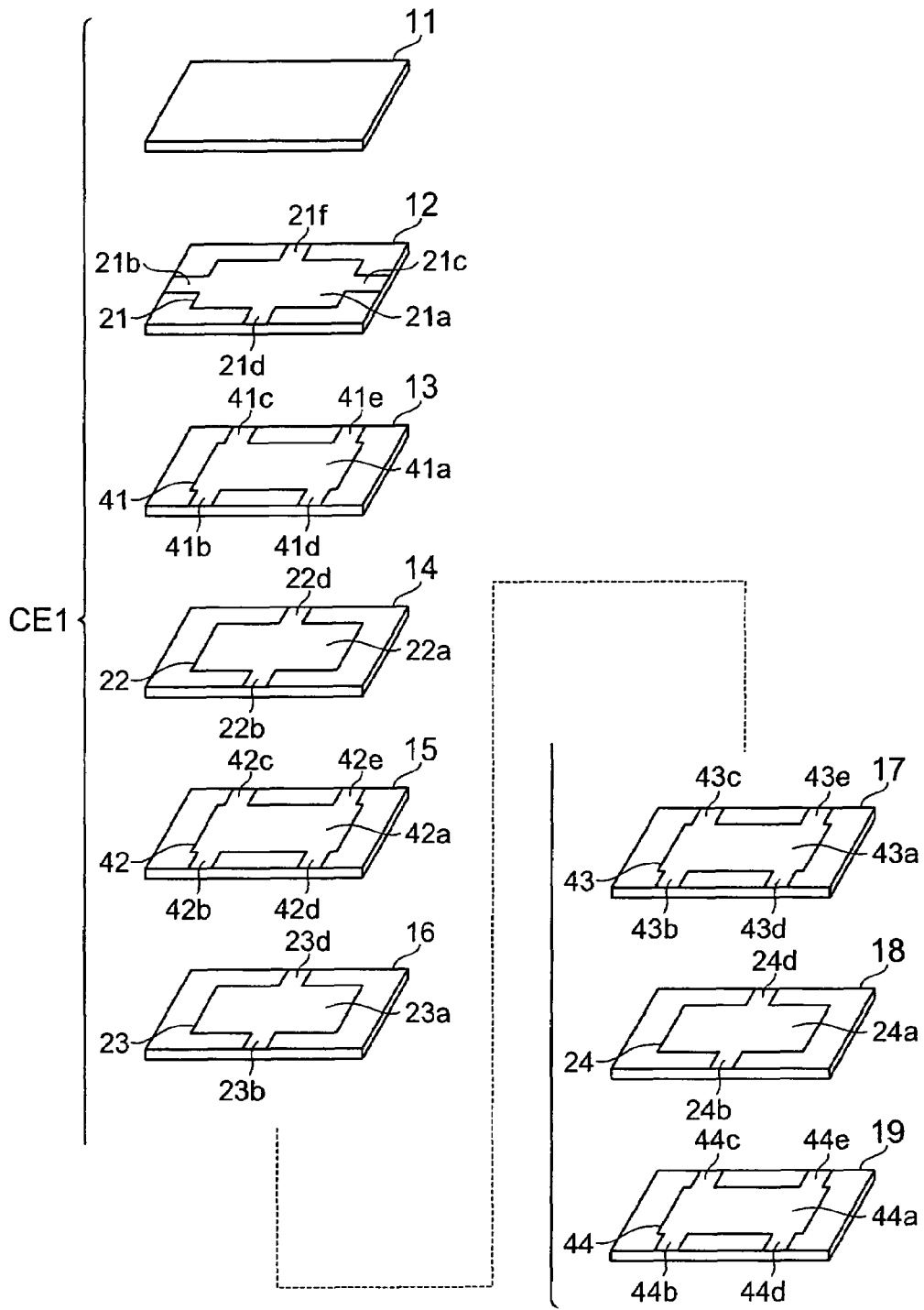
FIG. 7 is an exploded perspective view of a capacitor element body included in the multilayer filter according to the modification example of the embodiment.

A multilayer filter F3 according to a further modification example of the embodiment will be described below with reference to FIGS. 6 and 7. The multilayer filter F3 of the present modification example is different in the configuration of the grounding terminal electrodes and connection conductors from the multilayer filter F1 of the embodiment. FIG. 6 is a perspective view showing the multilayer filter according to the modification example of the embodiment. FIG. 7 is an exploded perspective view showing a capacitor element body included in the multilayer filter of the modification example.

The multilayer filter F3 of the modification example, as shown in FIG. 6, has a capacitor element body CE1, signal terminal electrodes 1, 2, grounding terminal electrodes 3-6, and connection conductors 7, 8. The signal terminal electrodes 1, 2, grounding terminal electrodes 3-6, and connection conductors 7, 9 are placed on the exterior of the capacitor element body CE1.

The grounding terminal electrode 5 is placed on the first side face CE1c of the capacitor element body CE1 as the grounding terminal electrode 3 is. The grounding terminal electrode 5 is formed so as to cover a portion of the first side face CE1c and up onto the first and second principal faces CE1e, CE1f. The grounding terminal electrode 6 is placed on the second side face CE1d of the capacitor element body CE1 as the grounding terminal electrode 4 is. The grounding terminal electrode 6 is formed so as to cover a portion of the second side face CE1d and up onto the first and second principal faces CE1e, CE1f.

The grounding terminal electrodes 3, 5 and the connection conductor 7 are arranged in the order of grounding terminal electrode 3, connection conductor 7, and grounding terminal electrode 5 in the direction from the first end face CE1a to the second end face CE1b on the first side face CE1c of the capacitor element body CE1. The grounding terminal electrodes 4, 6 and the connection conductor 9 are arranged in the order of grounding terminal electrode 4, connection conductor 9, and grounding terminal electrode 6 in the direction from the first end face CE1a to the second end face CE1b on the second side face CE1d of the capacitor element body CE1. The grounding terminal electrode 5 and the grounding terminal electrode 6 are opposed to each other in the opposing direction of the first side face CE1c and the second side face CE1d.

The grounding terminal electrodes 5, 6 are formed, for example, by applying an electroconductive paste containing an electroconductive metal powder and glass frit, onto the exterior of the capacitor element body CE1 and baking it, as the grounding terminal electrodes 3, 4 and others are. A plated layer may be formed on the baked terminal electrodes and connection conductors according to need. These signal terminal electrodes 1, 2, grounding terminal electrodes 3-6, and connection conductors 7, 9 are formed as being electrically isolated from each other on the surface of the capacitor element body CE1.

A first signal internal electrode 22-24 includes a main electrode portion 22a-24a, and lead portions 22b-24b, 22d-24d. The lead portion 22b-24b extends from the central part in the longer-side direction of the main electrode portion 21a toward the first side face CE1c and is led out to the first side face CE1c. The lead portion 22b-24b is electrically and physically connected to the connection conductor 7. The lead portion 22d-24d extends from the central part in the longer-side direction of the main electrode portion 21a toward the second side face CE1d and is led out to the second side face CE1d. The lead portion 22d-24d is electrically and physically connected to the connection conductor 9. These cause the first signal internal electrodes 22-24 to be electrically and physically connected to the connection conductors 7, 9.

The second signal internal electrode 21 includes a main electrode portion 21a, and lead portions 21b, 21c, 21d, 21f. The lead portion 21d extends from the central part in the longer-side direction of the main electrode portion 21a toward the first side face CE1c and is led out to the first side face CE1c. The lead portion 21d is electrically and physically connected to the connection conductor 7. The lead portion 21f extends from the central part in the longer-side direction of the main electrode portion 21a toward the second side face CE1d and is led out to the second side face CE1d. The lead portion 21f is electrically and physically connected to the connection conductor 9. These cause the second signal internal electrode 21 to be electrically and physically connected to the signal terminal electrodes 1, 2 and to the connection conductors 7, 9.

A grounding internal electrode 41-44 includes a main electrode portion 41a-44a, and lead portions 41b-44b, 41c-44c, 41d-44d, 41e-44e.

The lead portion 41b-44b extends from the edge on the first end face CE1a side of the main electrode portion 41a-44a toward the first side face CE1c and is led out to the first side face CE1c. The lead portion 41d-44d extends from the edge on the second end face CE1b side of the main electrode portion 41a-44a toward the first side face CE1c and is led out to the first side face CE1c. The lead portion 41c-44c extends from the edge on the first end face CE1a side of the main electrode portion 41a-44a toward the second side face CE1d and is led out to the second side face CE1d. The lead portion 41e-44e extends from the edge on the second end face CE1b side of the main electrode portion 41a-44a toward the second side face CE1d and is led out to the second side face CE1d.

The lead portion 41d-44d is electrically and physically connected to the grounding terminal electrode 5. The lead portion 41e-44e is electrically and physically connected to the grounding terminal electrode 6. These cause the grounding internal electrodes 41-44 to be electrically and physically connected to the grounding terminal electrodes 3-6.

In the multilayer filter F3 constructed as described above, a capacitance component CC and a resistance component RC are formed as shown in FIG. 3, as in the case of the multilayer filter F1. In this case, the signal terminal electrodes 1, 2 are connected to signal conductors, the grounding terminal electrodes 3-6 are connected to a ground connection conductor, and the connection conductors 7, 9 are not connected directly to any signal conductor or any ground connection conductor. The capacitance component CC is composed of the insulator layers 12-18, and the signal internal electrodes 21-24 and grounding internal electrodes 41-44 opposed with the insulator layer 12-18 in between. The resistance component RC is composed of the signal internal electrodes 21-24 and the connection conductors 7, 9.

Incidentally, in the multilayer filter F3, all the signal internal electrodes 21-24 are not connected directly to the terminal electrodes, only at least one of the signal internal electrodes (the second signal internal electrode 21) is connected directly to the signal terminal electrodes 1, 2, and the remaining signal internal electrodes (first signal internal electrodes 22-24) are connected indirectly to the signal terminal electrodes 1, 2 through the connection conductors 7, 9 and the second signal internal electrode 21. Namely, in the multilayer filter F3, the plurality of signal internal electrodes 21-24 are connected to each other through the connection conductors 7, 9, and the signal internal electrode or signal internal electrodes as many as at least one out of the plurality of signal internal electrodes 21-24 and at most a number one smaller than the total number of the signal internal electrodes 21-24 (one signal internal electrode 21 in the present embodiment) are connected to the signal terminal electrodes 1, 2.

In the multilayer filter F3, with focus on the signal terminal electrode 1, the respective resistance components of the connection conductors 7, 9 are connected in series to the signal terminal electrode 1. With focus on the signal terminal electrode 2, the respective resistance components of the connection conductors 7, 9 are connected in series to the signal terminal electrode 2.

For these reasons, the multilayer filter F3 comes to have the resistance of the resistance component RC larger than the multilayer filter having the configuration in which all the signal internal electrodes 21-24 are connected through their lead portions to the signal terminal electrodes 1, 2.

In the multilayer filter F3, the resistance of the resistance component RC varies when the number of signal internal electrodes connected directly to the signal terminal electrodes 1, 2 is changed in the range of at least one and at most the number one smaller than the total number of the signal internal electrodes 21-24. In the multilayer filter F3, when the location of the signal internal electrode connected directly to the signal terminal electrodes 1, 2 (the position in the lamination direction in the capacitor element body CE1) is changed, connection states of the resistance components of the connection conductors 7, 9 (series connection or parallel connection) vary, so as to vary the resistance of the resistance component RC.

In the present modification example, as in the case of the aforementioned embodiment, it is also feasible to readily and accurately control the resistance of the resistance component RC of the multilayer filter F3.

In the present modification example, as in the case of the aforementioned embodiment, it is also easy, for example, to connect the signal terminal electrodes 1, 2 to linear signal conductors, to connect the grounding terminal electrodes 3, 4 to a linear ground connection conductor, and to connect the grounding terminal electrodes 5, 6 to a linear ground connection conductor. These result in facilitating mounting of the multilayer filter F3.

The above described the preferred embodiment of the present invention, but it is noted that the present invention is not always limited to the above-described embodiment but can be modified in many ways without departing from the scope and spirit of the invention.

For example, the number of signal terminal electrodes connected to the second signal internal electrode 21 does not have to be limited to that described in the above-described embodiment and modification examples, but may be, for example, three or more. The number of grounding terminal electrodes connected to the grounding internal electrodes 41-44 does not have to be limited to those described in the above-described embodiment and modification examples, but may be, for example, one, or three, or five or more. The number of connection conductors does not have to be limited to those described in the above-described embodiment and modification examples, but may be, for example, one, or three, or five or more.

The arrangement of the signal terminal electrodes 1, 2, grounding terminal electrodes 3-6, and connection conductors 7-10 does not have to be limited to that described in the above-described embodiment and modification examples, but may be any arrangement as long as they are located on the exterior of the capacitor element body CE1. Therefore, it is also possible, for example, to arrange the signal terminal electrodes 1, 2 so as not to be opposed to each other in the opposing direction of the first and second end faces CE1a, CE1b of the capacitor element body CE1. For example, the grounding terminal electrodes 3-6 do not have to be opposed to each other in the opposing direction of the first and second side faces CE1c, CE1d of the capacitor element body CE1. For example, the connection conductors 7-10 do not have to be opposed to each other in the opposing direction of the first and second side faces CE1c, CE1d of the capacitor element body CE1.

The lamination number of insulator layers 11-19 and the lamination number of internal electrodes 21-24, 41-44 are not limited to those described in the aforementioned embodiment and modification examples. The shapes of the internal electrodes 21-24, 41-42 are not limited to those described in the embodiment and modification examples.

The number of second signal internal electrode 21 connected through the lead portions 21b, 21c to the signal terminal electrodes 1, 2, and the location thereof in the lamination direction are not limited to the number and location described in the aforementioned embodiment and modification examples. The second signal internal electrode 21 may also be arranged to be opposed to the first signal internal electrode with the insulator layer in between, instead of being opposed to the grounding internal electrode with the insulator layer in between.

The number of insulator layers between the first signal internal electrode 22-24 and the grounding internal electrode 41-44 should be at least one, but may be, for example, two or more. The number of insulator layers between the second signal internal electrode 21 and the grounding internal electrode 41 should be at least one, but may be, for example, two or more.

The capacitor element body CE1 of the multilayer filters F1-F3 may be laminated with further insulator layers, or with further insulator layers and internal electrodes alternately laminated.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A multilayer filter comprising:
a capacitor element body;
at least two signal terminal electrodes placed on an exterior of the capacitor element body;
at least one grounding terminal electrode placed on the exterior of the capacitor element body; and
at least one connection conductor placed on the exterior of the capacitor element body;
wherein the capacitor element body has a plurality of laminated insulator layers, a first signal internal electrode and a grounding internal electrode arranged so as to be opposed to each other with at least one first insulator layer out of the plurality of insulator layers in between, and a second signal internal electrode arranged so as to be opposed to either the first signal internal electrode or the grounding internal electrode with at least one second insulator layer out of the plurality of insulator layers in between;

wherein the first signal internal electrode is connected to the at least one connection conductor;

wherein the second signal internal electrode is connected to the at least two signal terminal electrodes and to the at least one connection conductor;

wherein the grounding internal electrode is connected to the at least one grounding terminal electrode;

wherein the capacitor element body is of a rectangular parallelepiped shape and has first and second principal faces of a rectangular shape opposed to each other, first and second side faces extending in a longer-side direction of the first and second principal faces so as to connect the first and second principal faces, and opposed to each other, and first and second end faces extending in a shorter-side direction of the first and second principal faces so as to connect the first and second principal faces, and opposed to each other;

wherein the signal terminal electrodes are disposed on the first and second end faces, respectively;

wherein the grounding terminal electrodes are disposed on the first and second side faces, respectively;

wherein the connection conductors are disposed on the first and second side faces, respectively;

wherein the first signal internal electrode includes a main electrode portion whose longer sides extend along the longer-side direction of the first and second principal faces, and lead portions extending from the main electrode portion toward the first and second side faces, respectively, and connected to the respective connection conductors;

wherein the second signal internal electrode includes a main electrode portion whose longer sides extend along the longer-side direction of the first and second principal faces, lead portions extending from the main electrode portion toward the first and second end faces, respectively, and connected to the respective signal terminal electrodes, and lead portions extending from the main electrode portion toward the first and second side faces, respectively, and connected to the respective connection conductors; and wherein the grounding internal electrode includes a main electrode portion whose longer sides extend along the longer-side direction of the first and second principal faces, and lead portions extending from the main electrode portion toward the first and second side faces, respectively, and connected to the respective grounding terminal electrodes.

* * * * *